United States Patent
Fukuo et al.

(10) Patent No.: US 9,391,606 B2
(45) Date of Patent: Jul. 12, 2016

(54) SEMICONDUCTOR INTEGRATED CIRCUIT DEVICE

(71) Applicant: Renesas Electronics Corporation, Kawasaki-shi (JP)

(72) Inventors: Noritaka Fukuo, Kawasaki (JP); Hideki Aono, Kawasaki (JP); Eiichi Murakami, Kawasaki (JP)

(73) Assignee: RENESAS ELECTRONICS CORPORATION, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/506,621

(22) Filed: Oct. 4, 2014

(65) Prior Publication Data
US 2015/0109046 A1  Apr. 23, 2015

(30) Foreign Application Priority Data
Oct. 18, 2013  (JP) .................................. 2013-217504

(51) Int. Cl.
| H03L 7/00 | (2006.01) |
| H03K 17/284 | (2006.01) |
| H03K 17/30 | (2006.01) |

(52) U.S. Cl.
CPC ............ *H03K 17/284* (2013.01); *H03K 17/302* (2013.01)

(58) Field of Classification Search
CPC ..................................................... H03K 17/284
See application file for complete search history.

(56) References Cited

U.S. PATENT DOCUMENTS

2015/0022258 A1*  1/2015  Sadate ................. H03K 17/163
                                                         327/398

FOREIGN PATENT DOCUMENTS

JP       2006-54499 A      2/2006

* cited by examiner

*Primary Examiner* — Daniel Puentes
(74) *Attorney, Agent, or Firm* — McGinn IP Law Group PLLC

(57) ABSTRACT

An NBTI malfunction of a P-channel MOS transistor is prevented. A semiconductor integrated circuit device includes a reset pulse control unit RPC. The reset pulse control unit RPC generates a reset pulse RP for recovery from degradation caused by NBTI of a MOS transistor that receives a negative voltage at the gate of the transistor in a standby status. After the generated reset pulse RP is inputted to the gate of the MOS transistor, an action control signal ACC for activating the MOS transistor is inputted to the gate of the MOS transistor to activate the transistor.

6 Claims, 7 Drawing Sheets

INITIAL STATE Q=0

INITIAL STATE Q=0

SEMICONDUCTOR INTEGRATED CIRCUIT DEVICE

CROSS-REFERENCE TO RELATED APPLICATIONS

The disclosure of Japanese Patent Application No. 2013-217504 filed on Oct. 18, 2013 including the specification, drawings and abstract is incorporated herein by reference in its entirety.

The present invention relates to a semiconductor integrated circuit device and particularly relates to a technique for effectively preventing a malfunction of a P-channel metal oxide semiconductor (MOS) transistor.

BACKGROUND

It is known that property changes called negative bias temperature instability (NBTI) appear over a P-channel MOS transistor formed in a semiconductor integrated circuit device and so on.

NBTI is a phenomenon in which the absolute value of the threshold voltage ($\Delta$Vth) of a P-channel MOS transistor gradually increases as a negative gate bias is applied to the gate of the transistor.

SUMMARY

As described above, if NBTI increases the threshold voltage of a transistor, the probability of malfunctions rises. For example, the transistor may not be turned on or may be turned on late. However, degradation of the transistor by NBTI is not taken into consideration at all, reducing the reliability of the transistor.

Three degradation modes caused by NBTI are known: (1) A fixed charge ($\Delta$Vot) in a gate oxide film that is not recovered, (2) the interface state of a gate oxide film/silicon (Si) substrate that is slowly recovered, and (3) a hole trap in a film that is quite easily recovered with a small time constant at about $-10^{-6}$s ($\mu$s). In this case, the hole trap in the film is recovered at, for example, about $-10^{-6}$s ($\mu$s)

In a circuit for a continuous AC operation, a component ($\Delta$Vh) quite easily recovered in (3) is recovered by an AC operation, which is expected to considerably reduce a degradation.

If the transistor is placed in a standby status, that is, in a state of DC stress, all the degradation modes need to be taken into consideration. As degradation caused by NBTI increases, it becomes difficult to obtain high reliability for a transistor.

In the case of a P-channel MOS transistor used for a flip-flop circuit or a SRAM (Static Random Access Memory) memory circuit in a long standby status, in particular, NBTI is considered to be seriously degraded by a DC stress.

Immediately after a long standby status, it becomes more difficult to obtain reliability for NBTI in an operation of a flip-flop circuit or a SRAM memory circuit, that is, an AC operation of the transistor. This may cause a malfunction in the flip-flop circuit or the SRAM memory circuit and so on, reducing the reliability of a semiconductor integrated circuit device.

An object of the present invention is to provide a technique for preventing NBTI from causing a malfunction of a P-channel MOS transistor.

The object, other objects, and new characteristics of the present invention will become apparent according to a description and the accompanying drawings of the present invention.

A semiconductor integrated circuit device according to an embodiment includes a reset pulse control unit. In response to an input of an action control signal for activating a MOS transistor, the reset pulse control unit generates a reset pulse that realizes recovery from a degradation caused by NBTI of the MOS transistor. Moreover, the reset pulse is inputted to the gate of a MOS transistor.

A semiconductor integrated circuit device according to an embodiment includes a reset pulse control unit. The reset pulse control unit generates a reset pulse that realizes recovery from a degradation caused by NBTI of a MOS transistor that receives a negative voltage at the gate of the transistor in a standby status.

After the reset pulse is inputted to the gate of the MOS transistor, an action control signal for activating the MOS transistor is inputted to the gate of the MOS transistor.

According to the embodiments, the reliability of the semiconductor integrated circuit device can be improved.

DETAILED DESCRIPTION

Figure 1:
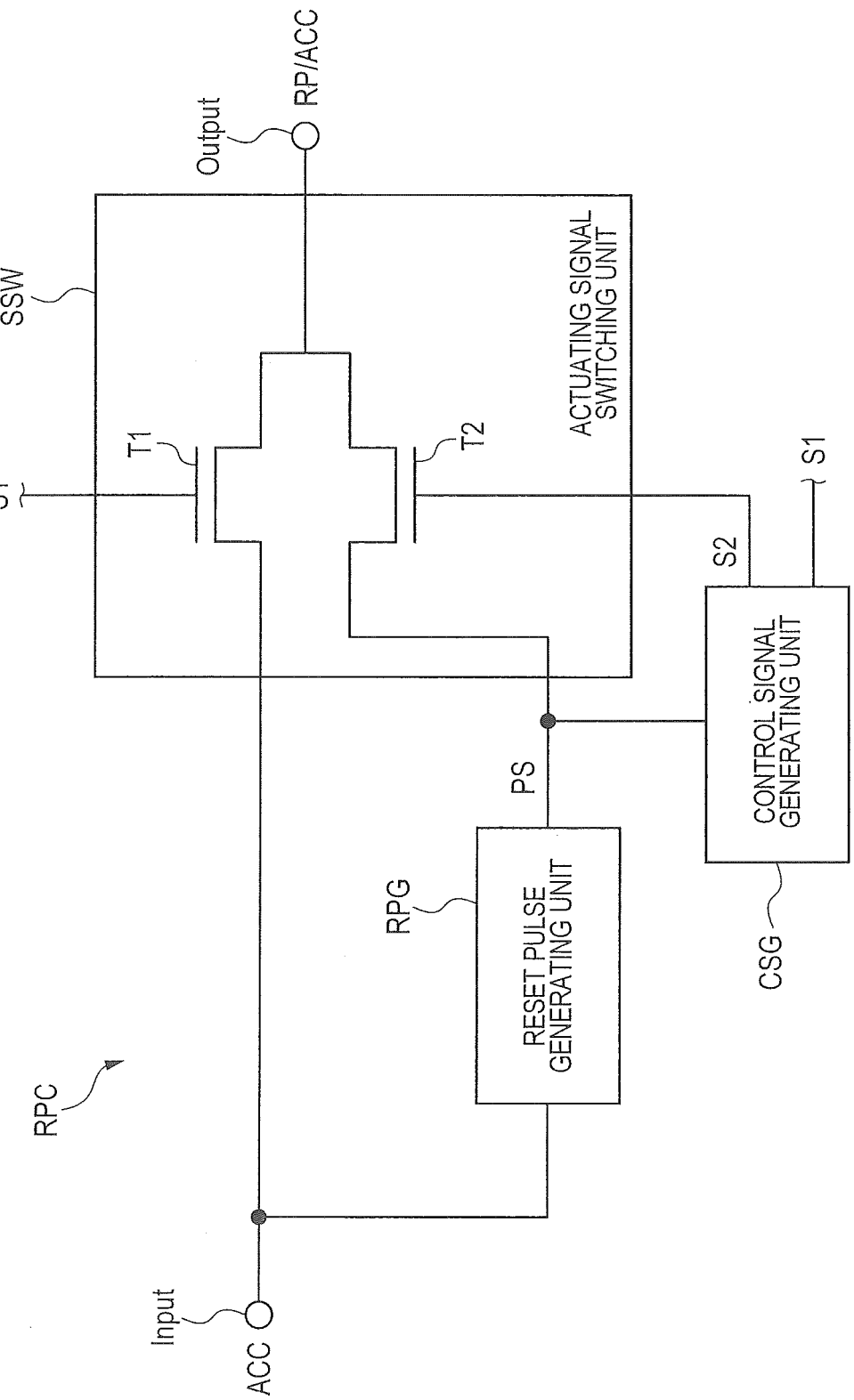
FIG. 1 is an explanatory drawing showing a structural example of a reset pulse control unit according to a first embodiment.

In the following embodiments, the present invention will be described in divided sections or embodiments if necessary. These sections or embodiments are not independent from one another unless otherwise specified. For example, one of the sections is a modification of a part or whole of the other section, detailed description, or a supplementary explanation of the other section.

In the following embodiments, the number of elements (the number of elements, a numeric value, a quantity, a range, etc.) is not limited to a specific number unless otherwise specified and theoretically limited to a specific number. Thus, the number of elements may be larger or smaller than a specific number.

Furthermore, in the following embodiments, the constituent elements (including elements and steps) are not always necessary unless otherwise specified and theoretically proved necessary.

Similarly, the shapes and the positional relationships of the constituent elements in the following embodiments substantially include analogous or similar shapes unless otherwise specified and theoretically proved different. This holds true for the numeric value and range.

In all drawings for explaining the embodiment, the same members are fundamentally indicated by the same reference numerals and the repeated explanation thereof is omitted. For clarification of the drawings, a hatch pattern may be formed even in a plan view.

(First Embodiment)
<Outline>

Three degradation modes caused by NBTI in related art technology are expressed by Equation 1:

NBTI ($\Delta$Vth)=fixed potential ($\Delta$Vot)+interface potential ($\Delta$Vit) +hole trap ($\Delta$Vh)  (Equation 1)

In Equation 1, the hole trap ($\Delta$Vh) in a film is a degradation mode that is quite easily recovered. This technique prevents a malfunction of a transistor by using the recoverable degradation.

In this technique, the gate of the transistor receives a reset pulse (e.g., Vgs=0 V) that can recover the degradation mode immediately before the transistor starts an AC operation from an inoperative status, that is, a standby status.

This recovers the hole trap $\Delta$Vh in the film, considerably reduces an NBTI degradation amount, and then performs a circuit operation, that is, an AC operation of the transistor, thereby improving the reliability and resistance of NBTI.

The embodiments will be described in detail according to the outline.

<A Structural Example of a Reset Pulse Control Unit>

FIG. 1 is an explanatory drawing showing a structural example of a reset pulse control unit according to a first embodiment.

A reset pulse control unit RPC is provided in a semiconductor integrated circuit device. The reset pulse control unit RPC outputs a reset pulse RP to, for example, the gate of a transistor including a P-channel MOS. The transistor is used for a functional block to be operated in the semiconductor integrated circuit device.

The reset pulse RP is inputted to the gate of the transistor immediately before the transistor including the P-channel MOS performs an AC operation from a standby status. This can achieve recovery from the degradation mode of the transistor.

As shown in FIG. 1, the reset pulse control unit RPC includes a reset pulse generating unit RPG, an actuating signal switching unit SSW, and a control signal generating unit CSG. The actuating signal switching unit SSW and the control signal generating unit CSG constitute a signal switching control unit.

The reset pulse generating unit RPG generates a pulse signal PS based on an action control signal ACC. The action control signal ACC is a control signal that is an AC operation for a target transistor and is outputted to the reset pulse control unit RPC from, for example, a control block provided in a semiconductor integrated circuit device.

The actuating signal switching unit SSW outputs the pulse signal PS or the action control signal ACC based on control signals S1 and S2. The actuating signal switching unit SSW outputs the pulse signal PS as the reset pulse RP applied to the gate of the transistor, before the AC operation of the transistor to be operated.

Subsequently, the action control signal ACC for an AC operation of the target transistor is outputted. The control signal generating unit CSG generates the control signals S1 and S2 based on the pulse signal PS generated by the reset pulse generating unit RPG.

<A Structural Example of the Reset Pulse Generating Unit>

Figure 2:
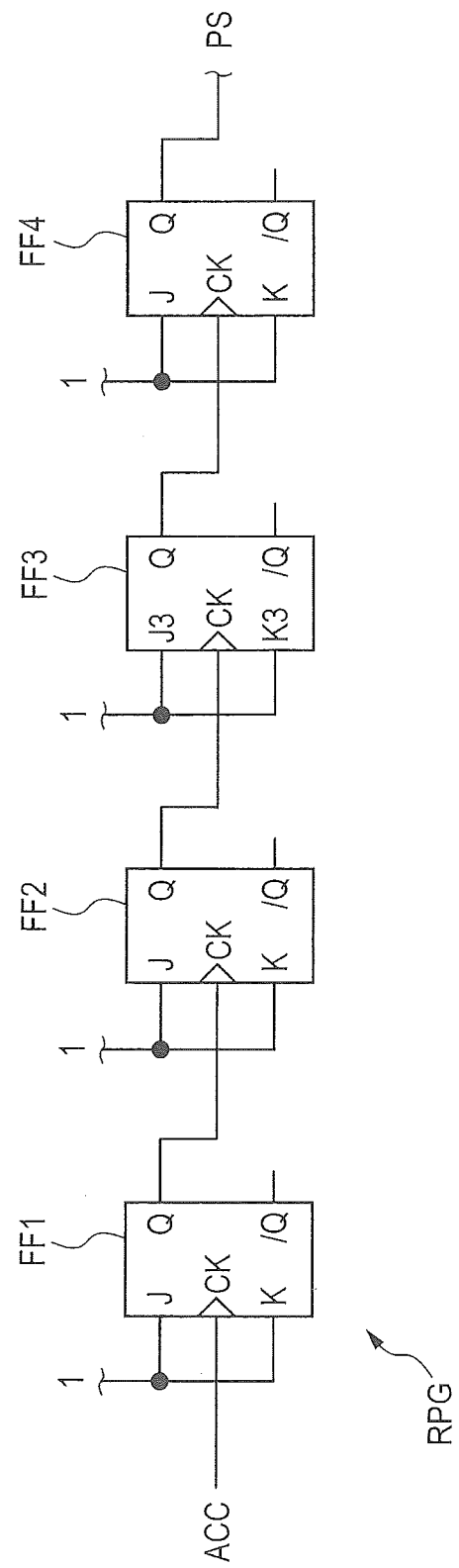
FIG. 2 is an explanatory drawing showing a structural example of a reset pulse generating unit included in the reset pulse control unit shown in FIG. 1.

FIG. 2 is an explanatory drawing showing a structural example of the reset pulse generating unit RPG included in the reset pulse control unit RPC shown in FIG. 1.

As shown in FIG. 2, the reset pulse generating unit RPG includes, for example, four flip-flop circuits FF1 to FF4. The flip-flop circuits FF1 to FF4 each include a JK flip-flop of positive edge trigger.

Fixed 1 (=ground potential GND) is inputted to a set terminal J and a reset terminal K of each of the flip-flop circuits FF1 to FF4. The ground potential GND is a reference potential in a circuit of a functional block to be operated.

A clock terminal CK of the flip-flop circuit FF1 is coupled to an input Input of the reset pulse control unit RPC. The input Input receives the action control signal ACC for an AC operation of the target transistor.

An output terminal Q of the flip-flop circuit FF1 is coupled to a clock terminal CK of the flip-flop circuit FF2. An output terminal Q of the flip-flop circuit FF2 is coupled to a clock terminal CK of the flip-flop circuit FF3.

Similarly, an output terminal Q of the flip-flop circuit FF3 is coupled to a clock terminal CK of the flip-flop circuit FF4. A signal outputted from an output terminal Q of the flip-flop circuit FF4 is the pulse signal PS.

As shown in FIG. 1, the actuating signal switching unit SSW includes two transistors T1 and T2. The transistors T1 and T2 each include an N-channel MOS. One end of the source/drain of the transistor T1 is coupled to the input Input. The gate of the transistor T1 is coupled so as to receive the control signal S1 generated by the control signal generating unit CSG.

One end of the source/drain of the transistor T2 is coupled so as to receive the pulse signal PS generated by the reset pulse generating unit RPG. The gate of the transistor T2 is coupled so as to receive the control signal S2 generated by the control signal generating unit CSG.

The other end of the source/drain of the transistor T1 and the other end of the source/drain of the transistor T2 are coupled in a shared manner. The joint of the transistor T1 and the transistor T2 is coupled to an output Output. The output Output is coupled to the gate of the transistor to be operated.

The actuating signal switching unit SSW turns on the transistors T1 and T2 based on the control signals S1 and S2 so as to switches between an output of the pulse signal PS, which is generated by the reset pulse generating unit RPG, as the reset pulse RP and an output of the action control signal ACC.

<A Structural Example of the Control Signal Generating Unit>

Figure 3:
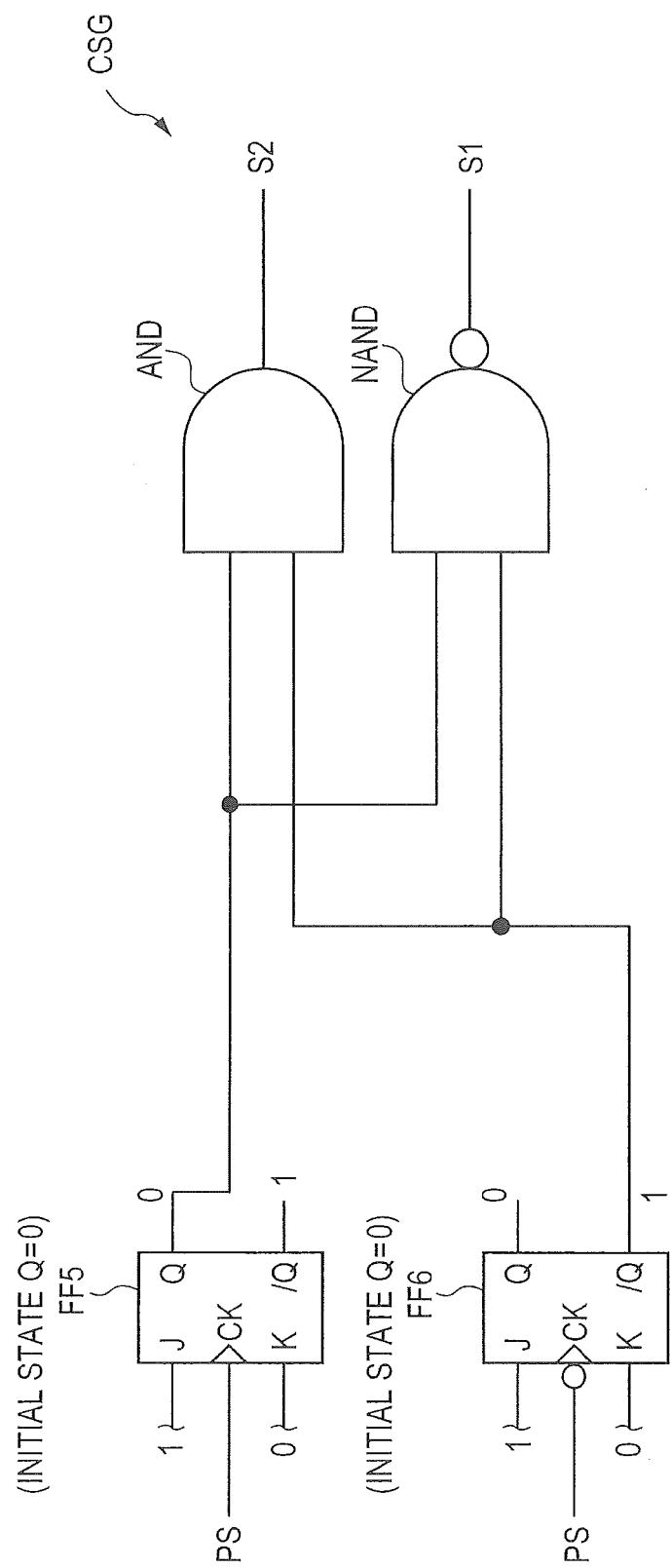
FIG. 3 is an explanatory drawing showing a structural example of a control signal generating unit included in the reset pulse control unit shown in FIG. 1.

FIG. 3 is an explanatory drawing showing a structural example of the control signal generating unit CSG included in the reset pulse control unit RPC shown in FIG. 1.

As shown in FIG. 3, the control signal generating unit CSG includes flip-flop circuits FF5 and FF6, an AND circuit AND, and a NAND circuit NAND. The flip-flop circuit FF5 includes a JK flip-flop of positive edge trigger. The flip-flop circuit FF6 includes a JK flip-flop of negative edge trigger.

Fixed 1 (=ground potential GND) is inputted to set terminals J of the flip-flop circuits FF5 and FF6.

Fixed 0 (=power supply voltage VDD) is inputted to reset terminals K of the flip-flop circuits FF5 and FF6. The power supply voltage VDD is, for example, a negative voltage of about −1.0 to −1.5 V.

A clock terminal CK of the flip-flop circuit FF5 is coupled so as to receive the pulse signal PS generated by the reset pulse generating unit RPG. A clock terminal CK of the flip-flop circuit FF6 is coupled so as to receive the inverted signal of the pulse signal PS generated by the reset pulse generating unit RPG.

One of the inputs of the AND circuit AND and one of the inputs of the NAND circuit NAND are coupled to an output terminal Q of the flip-flop circuit FF5. The other input of the AND circuit AND and the other input of the NAND circuit NAND are coupled to an output terminal /Q of the flip-flop circuit FF6. In this case, the output terminal /Q outputs the inverted signal of the output terminal Q.

The output of the AND circuit AND is coupled to the gate of the transistor T2 while the output of the NAND circuit NAND is coupled to the gate of the transistor T1. A signal outputted from the output of the AND circuit AND is the control signal S2. A signal outputted from the output of the NAND circuit NAND is the control signal S1.

<An Operation Example of the Reset Pulse Control Unit>

Referring to FIGS. 1 to 5, the operations of the reset pulse control unit will be described below.

Figure 4:
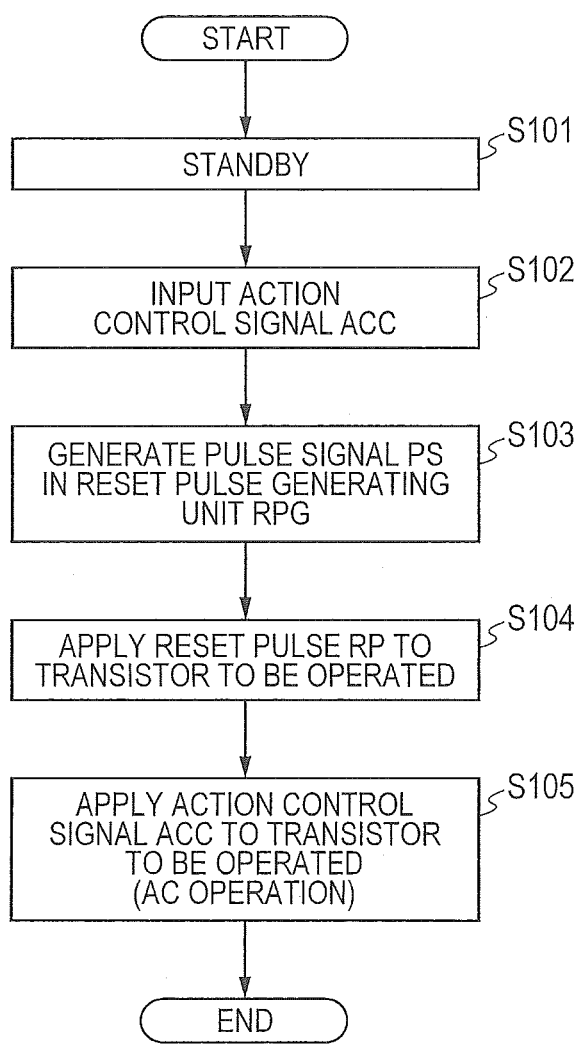
FIG. 4 is a flowchart showing an example of the operation of the reset pulse control unit shown in FIG. 1.
Figure 5:
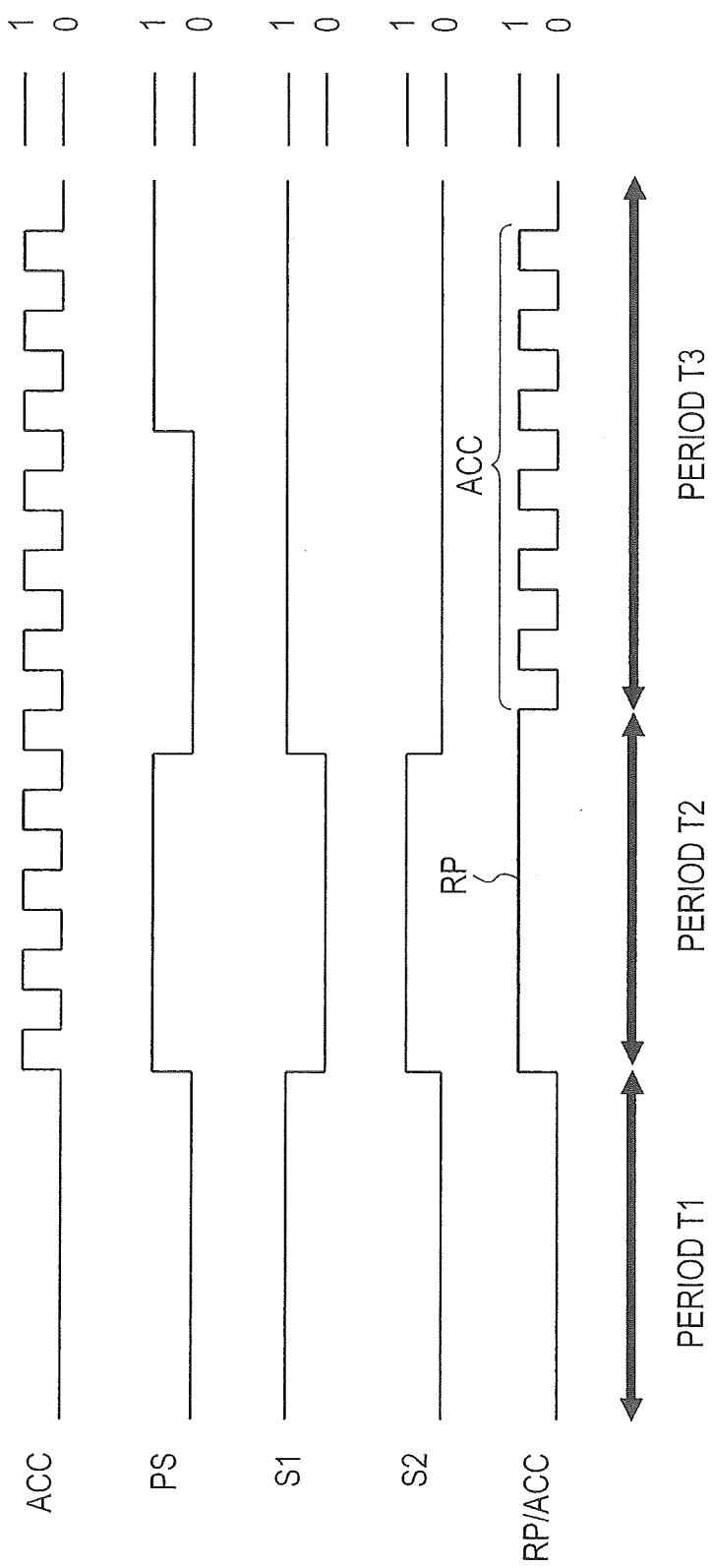
FIG. 5 is a timing chart showing the signals of the units of the reset pulse control unit.

FIG. 4 is a flowchart showing an example of the operation of the reset pulse control unit RPC. FIG. 5 is a timing chart showing the signals of the units of the reset pulse control unit RPC.

FIG. 5 shows, from the top to the bottom, the signal timing of the action control signal ACC for an AC operation of the transistor included in the circuit to be operated, the reset pulse RP outputted from the reset pulse generating unit RPG, the control signals S1 and S2 generated by the control signal generating unit CSG, and the reset pulse RP or the action control signal ACC outputted from the actuating signal switching unit SSW.

First, the action control signal ACC is set at 0. (=power supply voltage VDD) and a target functional block is placed in a standby status (Step S101). In this case, the target functional block is, for example, a flip-flop.

The flip-flop is a circuit that is placed in a standby status for a longer time than a circuit operation time, that is, an AC operation time. As the standby time increases, the threshold voltage of the P-channel MOS transistor used for the flip-flop may be considerably increased by NBTI.

When the target functional block is in a standby status, the control signal S1 outputted from the control signal generating unit CSG is set at 1 (=power supply voltage VDD) and the control signal S2 is set at 0 (=ground potential GND). In this state, the N-channel MOS transistor T1 of the actuating signal switching unit SSW is turned on, meanwhile, the N-channel MOS transistor T2 is turned off. This applies 0 (=power supply voltage VDD) to the gate of the P-channel MOS transistor of the target functional block (period T1 in FIG. 5).

In a standby status, the gate of the transistor receives 0, that is, a negative voltage of about −1.0 V to −1.5 V, causing NBTI to degrade the transistor.

Subsequently, when the action control signal ACC is inputted to the reset pulse control unit RPC to operate the target functional block (Step S102), the reset pulse generating unit RPG generates the pulse signal PS based on the action control signal ACC (Step S103).

The generated pulse signal PS is outputted as the reset pulse RP from the reset pulse control unit RPC (period T2 in FIG. 5) and then is applied to the gate of the transistor (Step S104).

In this case, as described above, the flip-flop circuits FF1 to FF4 in the reset pulse generating unit RPG are JK flip-flops of positive edge trigger with the output terminals Q initially set at 0.

When the inputs of the set terminal J and the reset terminal K are both set at 1, the JK flip-flop performs switching between 0 and 1 states, that is, a toggle operation each time a clock pulse is inputted to the clock terminal CK.

Thus, when the action control signal ACC is inputted to the clock terminal CK of the flip-flop circuit FF1, 1 is outputted from the output terminal Q of the flip-flop circuit FF1 for a period of the action control signal ACC.

Furthermore, 1 is outputted from the output terminal Q of the flip-flop circuit FF2 for a period of the signal outputted from the output terminal Q; meanwhile, 1 is outputted from the output terminal Q of the flip-flop circuit FF3 for a period of the signal outputted from the output terminal Q of the flip-flop circuit FF2. Similarly, 1 is outputted from the output terminal Q of the flip-flop circuit FF4 for a period of the signal outputted from the output terminal Q of the flip-flop circuit FF3.

Thus, the pulse signal PS set at 1 for eight periods of the action control signal ACC is outputted from the reset pulse generating unit RPG. The length of the pulse signal PS can be adjusted by increasing or reducing the number of flip-flop circuits of the reset pulse generating unit RPG.

In the control signal generating unit CSG, the output terminal Q of the flip-flop circuit FF5 is initially set at 0 and the output terminal /Q of the flip-flop circuit FF6 is initially set at 1.

As described above, the flip-flop circuit FF5 is a JK flip-flop of positive edge trigger, whereas the flip-flop circuit FF6 is a JK flip-flop of negative edge trigger.

Thus, when the pulse signal PS becomes 1, 1 is outputted from the output terminal Q of the flip-flop circuit FF5 and the output terminal /Q of the flip-flop circuit FF6. The control signal S1 outputted from the NAND circuit NAND is set at 0; meanwhile, the control signal S2 outputted from the AND circuit AND is set at 1.

Hence, the transistor T1 of the actuating signal switching unit SSW is turned off, the transistor T2 is turned on, and the pulse signal PS generated by the reset pulse generating unit RPG is set at 1 and is outputted as the reset pulse RP from the actuating signal switching unit SSW.

The input of the reset pulse RP at 1 (=ground potential GND) to the gate of the transistor recovers the hole trap $\Delta Vh$ in a film in the transistor. This can reduce the increased threshold voltage of the transistor.

The time of the reset pulse RP applied to the gate of the transistor may be, for example, at least a half period of the action control signal ACC. If the period of the action control signal ACC fluctuates, the application time of the reset pulse RP is at least a half the fastest period.

In this case, the reset pulse RP is set at 1 (=ground potential GND) If the reset pulse RP has a higher voltage value than the threshold voltage of the transistor, the threshold voltage increased by NBTI can be reduced.

When the pulse signal PS outputted from the reset pulse generating unit RPG changes from 1 to 0, the control signal S1 outputted from the NAND circuit NAND is 1 and the control signal S2 outputted from the AND circuit AND is 0.

Thus, the transistor T1 of the actuating signal switching unit SSW is turned on, the transistor T2 is turned off, and the action control signal ACC is outputted from the actuating signal switching unit SSW (period T3 in FIG. 5). The transistor in the functional block to be operated starts operating based on the action control signal ACC (Step S105). This completes the processing of the reset pulse control unit RPC.

As described above, the reset pulse RP is applied to the gate of the target transistor to reduce the threshold voltage of the transistor, and then the action control signal ACC is applied to operate the transistor, thereby reducing the malfunctions of the transistor.

Moreover, the reliability of a semiconductor integrated circuit device by reducing the malfunctions of the transistor.

(Second Embodiment)
<Outline>

In the first embodiment, the reset pulse RP at 1 (=ground potential GND) is applied to the gate of the transistor. In a second embodiment, a reset pulse RP has a rectangular wave.

The rectangular wave of the reset pulse RP changes in amplitude between 1 (=ground potential GND) and 0 (=power supply voltage VDD). The reset pulse RP has a slower frequency than the frequency of an action control signal ACC. The reset pulse RP is outputted for a certain period, and then the action control signal ACC is outputted.

As in FIG. 1 of the first embodiment, a reset pulse control unit RPC includes a reset pulse generating unit RPG, an actuating signal switching unit SSW, and a control signal generating unit CSG.

<A Structural Example of the Reset Pulse Generating Unit>

Figure 6:
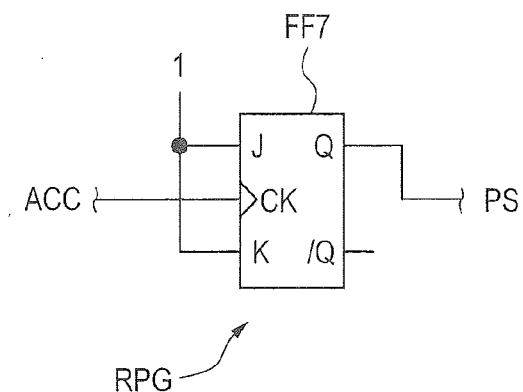
FIG. 6 is an explanatory drawing showing a structural example of a reset pulse generating unit included in a reset pulse control unit according to a second embodiment.

FIG. 6 is an explanatory drawing showing a structural example of the reset pulse generating unit RPG included in the reset pulse control unit RPC according to the second embodiment.

As shown in FIG. 6, the reset pulse generating unit RPG includes a flip-flop circuit FF7. The flip-flop circuit FF7 includes a JK flip-flop of positive edge trigger.

Fixed 0 (=power supply voltage VDD) is inputted to a set terminal J and a reset terminal K of the flip-flop circuit FF7. Furthermore, a clock terminal CK of the flip-flop circuit FF7 is coupled to an input Input of the reset pulse control unit RPC.

When the action control signal ACC is inputted to the clock terminal CK of the flip-flop circuit FF7, 1 is outputted from an output terminal Q of the flip-flop circuit FF7 for a period of the action control signal ACC. A signal from the output terminal Q of the flip-flop circuit FF7 is outputted as a pulse signal PS.

<A Structural Example of the Control Signal Generating Unit>

Figure 7:
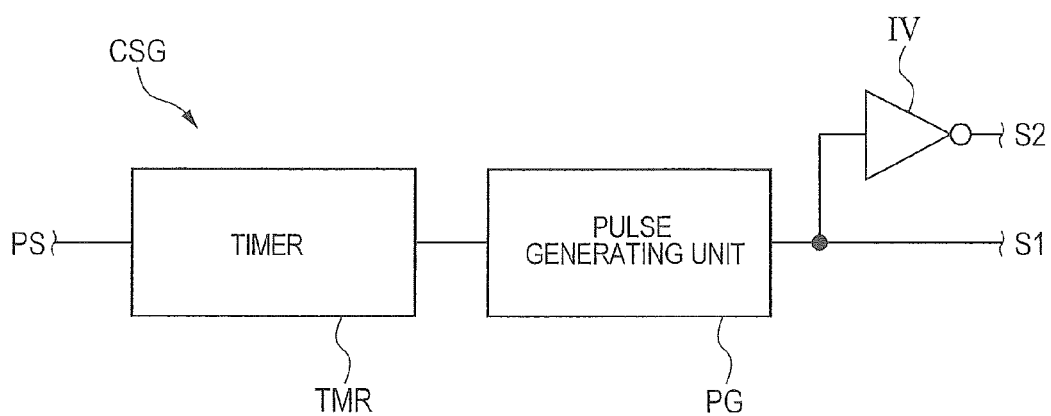
FIG. 7 is an explanatory drawing showing a structural example of a control signal generating unit included in the reset pulse control unit according to the second embodiment.

FIG. 7 is an explanatory drawing showing a structural example of the control signal generating unit CSG included in the reset pulse control unit RPC according to the second embodiment.

As shown in FIG. 7, the control signal generating unit CSG includes a timer TMR, a pulse generating unit PG, and an inverter IV. The input of the timer TMR is coupled so as to receive the pulse signal PS generated by the reset pulse generating unit RPG.

The output of the timer TMR is coupled to the input of the pulse generating unit PG. When the pulse signal PS generated by the reset pulse generating unit RPG is inputted, the timer TMR outputs a timer signal for a certain period.

The pulse generating unit PG is a pulse generating circuit. The pulse generating unit PG outputs a pulse of 0 from the output of the pulse generating unit PG. The output of the pulse generating unit PG is coupled to the gate of a transistor T1 in the actuating signal switching unit SSW. A pulse signal outputted from the output of the pulse generating unit PG is a control signal S1.

The output of the pulse generating unit PG is coupled to the input of the inverter IV while the output of the inverter IV is coupled to the gate of a transistor T2 in the actuating signal switching unit SSW. The inverter IV inverts the pulse signal outputted from the output of the pulse generating unit PG and then outputs the signal as a control signal S2.

<An Operation Example of the Reset Pulse Control Unit>

The operations of the reset pulse control unit RPC will be described below.

Figure 8:
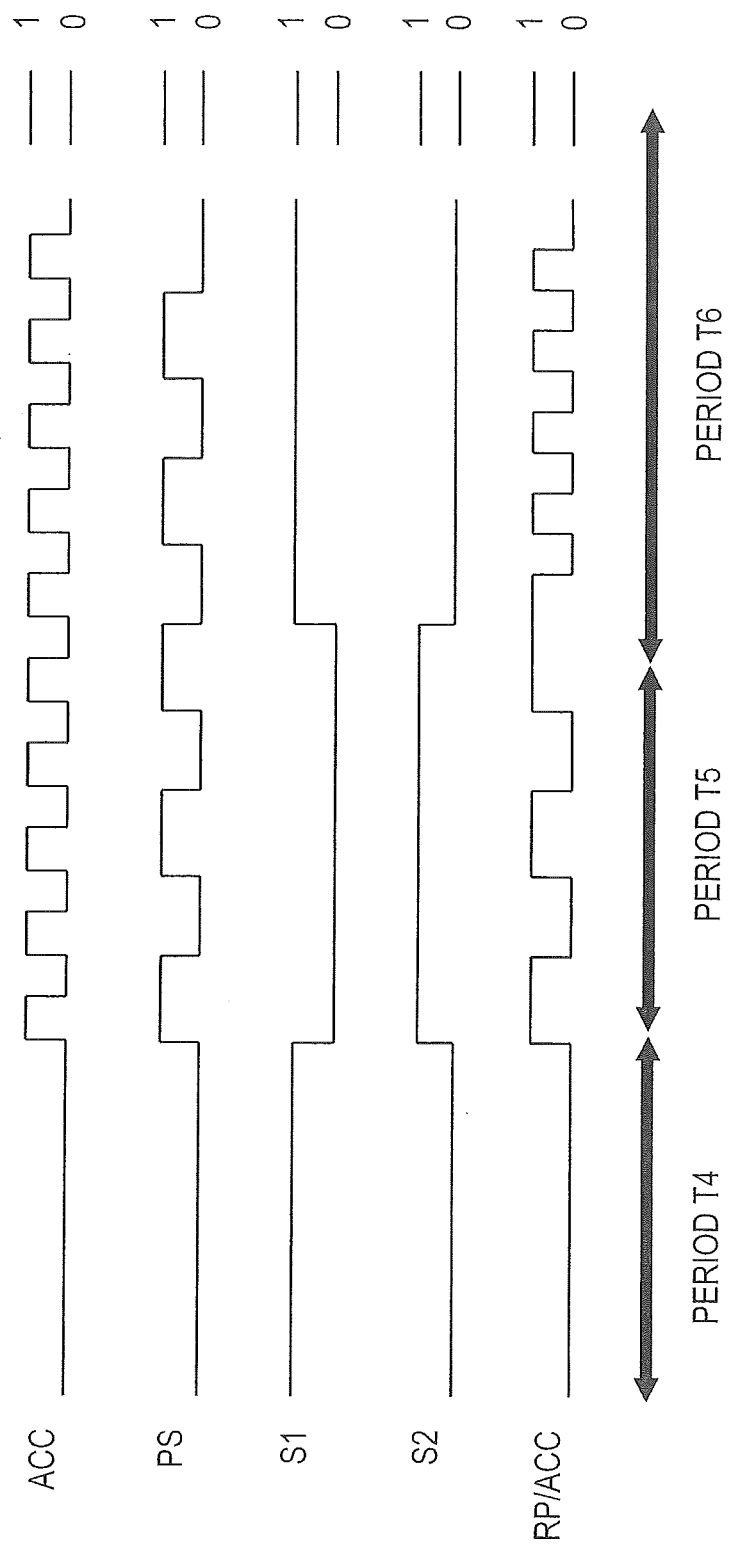
FIG. 8 is a timing chart showing the signals of the units of the reset pulse control unit.

FIG. 8 is a timing chart showing the signals of the units of the reset pulse control unit RPC.

FIG. 8 shows, from the top to the bottom, the signal timing of the action control signal ACC for an AC operation of the transistor included in the circuit to be operated, the reset pulse RP outputted from the reset pulse generating unit RPG, the control signals S1 and S2 generated by the control signal generating unit CSG, and the reset pulse RP or the action control signal ACC outputted from the actuating signal switching unit SSW.

First, the action control signal ACC is set at 0 (=power supply voltage VDD) and a target functional block is placed in a standby status (Period T4 in FIG. 8). Subsequently, when the action control signal ACC is inputted to the reset pulse control unit RPC to operate the target functional block, the reset pulse generating unit RPG generates the pulse signal PS having a rectangular wave.

The generated pulse signal PS is outputted as the reset pulse RP from the reset pulse control unit RPC (period T5 in FIG. 8) and then is applied to the gate of the transistor.

In this case, the output terminal Q of the flip-flop circuit FF7 in the reset pulse generating unit RPG is initially set at 0. As described above, the flip-flop circuit FF7 is a JK flip-flop of positive edge trigger. Thus, when the action control signal ACC is inputted to the clock terminal CK of the flip-flop circuit FF7, the pulse signal PS with a rectangular wave repeatedly set at 1 and 0 is outputted from the output terminal Q in each period of the action control signal ACC. The frequency of the pulse signal PS can be adjusted by increasing or reducing the number of flip-flops of the reset pulse generating unit RPG.

The pulse signal PS is inputted to the timer TMR. When the pulse signal PS is inputted, the timer TMR outputs a timer signal for a certain period. The pulse generating unit PG outputs a pulse of 0 while the timer signal is inputted.

The pulse is outputted as the control signal S1, is inverted by the inverter IV, and then is outputted as the control signal S2. Thus, the transistor T1 is turned off, the transistor T2 is turned on, and the pulse signal PS generated by the reset pulse generating unit RPG is outputted as the reset pulse RP.

At the end of a period set for the timer TMR, the timer signal becomes inactive and the pulse outputted from the pulse generating unit PG is set at 1. Thus, the transistor T1 is turned on and the transistor T2 is turned off, outputting the action control signal ACC (period T6 in FIG. 8).

In this case, the reset pulse RP may have a slower frequency than, for example, the frequency of the action control signal ACC. If the frequency of the action control signal ACC fluctuates, the frequency of the reset pulse RP is set with a slower period than the fastest frequency.

This can also reduce the malfunctions of the transistor. Moreover, the reliability of the semiconductor integrated circuit device can be improved by reducing the malfunctions of the transistor.

The present invention was specifically described based on the embodiments implemented by the present inventors. As a matter of course, the present invention is not limited to the embodiments and can be changed in various ways without departing from the scope of the invention.

The present invention includes various modifications and is not limited to the embodiments. For example, the embodiments were described in detail to simplify the explanation of the present invention. Thus, it is not always necessary to provide all the described configurations.

Moreover, the configurations of one of the embodiments may be partially replaced with those of the other embodiment or the configurations of one of the embodiments may further include the configurations of the other embodiment. Alternatively, the configurations of the embodiments may partially allow the addition of other configurations, deletion, and replaceme.

What is claimed is:

1. A semiconductor integrated circuit device, comprising:
a reset pulse control unit that generates a reset pulse for recovery from degradation caused by Negative Bias Temperature Instability (NBTI) of a Metal Oxide Semiconductor (MOS) transistor, inputs the reset pulse to a gate of the MOS transistor, and then inputs an action control signal for activating the MOS transistor to the gate of the MOS transistor,
wherein the reset pulse control unit comprises:
a reset pulse generating unit that generates the reset pulse based on the action control signal; and
a signal switching control unit that outputs one of the action control signal and the reset pulse to the gate of the MOS transistor based on the reset pulse generated by the reset pulse generating unit,
the signal switching control unit outputting the reset pulse to the gate of the MOS transistor before outputting the action control signal to the gate of the MOS transistor.

2. The semiconductor integrated circuit device according to claim 1, wherein the reset pulse generated by the reset pulse generating unit comprises a pulse signal having a higher voltage than an absolute value of a threshold voltage of the MOS transistor.

3. The semiconductor integrated circuit device according to claim 1, wherein the reset pulse generated by the reset pulse generating unit comprises a reference potential of the MOS transistor.

4. The semiconductor integrated circuit device according to claim 1, wherein the reset pulse generated by the reset pulse generating unit has a length of at least a half period of the action control signal.

5. The semiconductor integrated circuit device according to claim 1, wherein the reset pulse generated by the reset pulse generating unit has a rectangular wave with an amplitude set at a negative voltage applied to the gate of the MOS transistor and a reference potential.

6. The semiconductor integrated circuit device according to claim 5, wherein the reset pulse generated with a rectangular wave by the reset pulse generating unit has a slower frequency than a frequency of the action control signal.

* * * * *